(12) United States Patent
Davis et al.

(10) Patent No.: US 6,624,707 B1
(45) Date of Patent: Sep. 23, 2003

(54) METHOD AND CIRCUIT FOR IMPROVING LOCK-TIME PERFORMANCE FOR A PHASE-LOCKED LOOP

(75) Inventors: Craig Moore Davis, Englewood, CO (US); David Lindsay Broughton, Tacoma, WA (US); Edson Wayne Porter, Colorado Springs, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 123 days.

(21) Appl. No.: 09/753,179

(22) Filed: Jan. 2, 2001

(51) Int. Cl.$^7$ .............................................. H03L 7/085
(52) U.S. Cl. .............................. 331/25; 331/16; 331/17; 331/1 A; 327/156; 327/159
(58) Field of Search .......................... 331/1 A, 25, 17, 331/16, 183; 327/156, 159

(56) References Cited

U.S. PATENT DOCUMENTS 4,573,026 A * 2/1986 Curtis et al. ................. 332/124
5,973,572 A * 10/1999 Ukita ............................ 331/25
6,356,158 B1 * 3/2002 Lesea ............................ 331/11

* cited by examiner

*Primary Examiner*—Arnold Kinkead
(74) *Attorney, Agent, or Firm*—Vedder, Price, Kaufman & Kammholz, P.C.

(57) ABSTRACT

A gain control for a phase locked loop circuit is provided. In the phase-locked loop circuit, a voltage controlled oscillator generates a reference signal responsive to the level of a tuning voltage. A phase detector generates the tuning voltage update, which is indicative of a phase relationship between the reference signal and an input signal. A feedback circuit detects the tuning voltage and generates an adjustment signal in response. The adjustment signal is then used to adjust the loop gain at any specific tuning voltage. In a specific example, the adjustment signal is used to adjust the current gain of the phase detector in a manner that is complementary to the non-linear voltage gain of the voltage-controlled oscillator.

15 Claims, 5 Drawing Sheets

METHOD AND CIRCUIT FOR IMPROVING LOCK-TIME PERFORMANCE FOR A PHASE-LOCKED LOOP

FIELD OF THE INVENTION

The field of the present invention is electronic circuits. More particularly, the present invention relates to an electronic configuration for use with a phase-locked loop circuit.

BACKGROUND OF THE INVENTION

A phase-locked loop (PLL) circuit is widely used in electronics to synchronize or detect signal phase. In a specific application, PLL's are used in frequency-synthesized radio transmitters and receivers, and may be used as a detector in a frequency-modulation or phase-modulation receiver. Often, the PLL is used to synchronize signal-processing circuitry with an input signal. For example, the processing circuitry in a wireless device is generally synchronized with a received signal to facilitate processing and decoding information in the input signal.

The known PLL circuit is generally configured to receive an input signal from an outside source. For example, the input signal may be a signal received at an antenna member for a wireless device. The conventional PLL also has a voltage-controlled oscillator (VCO) outputting a reference signal. The known PLL uses a phase detector circuit that compares the phase of the input signal to the reference signal, and adjusts the VCO with a tuning voltage. Over time, the output signal of the VCO is adjusted to be in-phase with the input signal.

The time it takes to synchronize the reference signal to the input signal is commonly referred to as the lock-time. Lock-time is typically measured in clock cycles, and can be, for example, one hundred or more clock cycles long. During lock-time, processing circuitry is not synchronized with the input signal and is therefore not able to accurately and consistently process the input signal. It is therefore desirable that lock-time be as short as possible.

However, lock-time is dependent on many factors, and therefore lock-time will vary depending on specific conditions. For example, the gain of both the phase detector and the VCO will vary due to changes in temperature or supply voltage. Also, the gain of the VCO typically varies depending on the tuning voltage applied. Indeed, the response of the VCO may be highly non-linear, with a high gain when receiving a low tuning voltage, and a much lower gain when receiving a higher tuning voltage. Such non-linearity may lead to substantial variations in VCO response. Accordingly, the lock-time can vary widely. Due to this lack of predictability and consistency in lock-time, the processing circuitry is often configured to accommodate the longest expected lock-time.

There is therefore a need for a PLL circuit having a short lock-time. It would also be desirable that the lock-time be consistent and predictable.

SUMMARY OF THE INVENTION

It is therefore an object of the present invention to provide a PLL circuit with a more predictable and consistent lock time. It is another separate object of the present invention to reduce lock-time. To overcome the deficiencies in the known art, and to meet the stated objectives, a method and circuit for improving lock-time performance is provided.

Briefly, the present invention provides gain control for a phase locked loop circuit. In the phase-locked loop circuit, a voltage-controlled oscillator generates a reference signal responsive to the level of a tuning voltage. A phase detector generates a change in, or update to, the tuning voltage, which is indicative of a phase relationship between the reference signal and an input signal. A feedback circuit detects the tuning voltage and generates an adjustment signal in response. The adjustment signal is then used to adjust the phase detector gain to compensate for the non-linear gain of the voltage-controlled oscillator. In a specific example, the adjustment signal is used to adjust the current gain of the phase detector in a manner that is complementary to the non-linear voltage gain of the voltage-controlled oscillator.

Advantageously, the method and circuit for improving lock-time performance compensates for the non-linearity of the voltage controlled oscillator. In such a manner, the product of the gains of the voltage-controlled oscillator and the phase detector remain fairly constant, so the response characteristics of the phase-locked loop are more predictable. Accordingly, the lock time for the PLL becomes more predictable and may be reduced.

These and other features and advantages of the present invention will be appreciated from review of the following detailed description of the invention, along with the accompanying figures in which like reference numerals refer to like parts throughout.

DETAILED DESCRIPTION OF THE INVENTION

Figure 1:
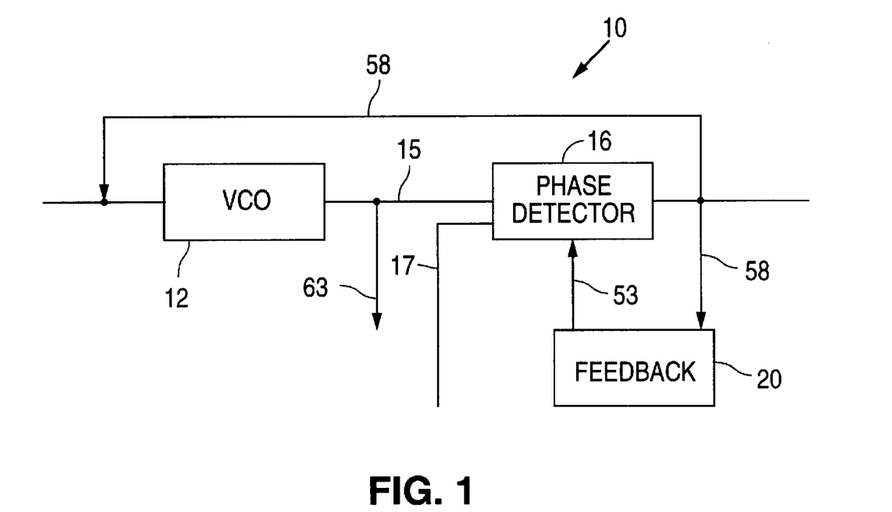
FIG. 1 is a block diagram of a circuit for improving lock-time performance in accordance with the present invention.

In accordance with the present invention, a phase-locked loop (PLL) circuit for improving lock-time is provided. More particularly, the disclosed PLL circuit is configured with a feedback circuit that compensates for certain non-linearity in the PLL circuit. Referring now to FIG. 1, the PLL circuit 10 has a voltage controlled oscillator (VCO) generating a reference signal 15. The VCO is controlled by the tuning voltage 58. Accordingly, the frequency of reference signal 15 is adjusted in response to changes to the tuning voltage 58. However, as described earlier, the VCO 12 has a non-linear gain response to the tuning voltage 58. For example, when the tuning voltage 58 is relatively low, the VCO 12 will have a high gain. Conversely, when the tuning voltage 58 is relatively high, the VCO 12 will have a much lower gain. If left uncompensated, such a non-linear VCO response may result in widely varying loop gains, which can affect loop lock-time periods. The tuning voltage 58 is provided by the output from the phase detector 16. The reference voltage 15 is one signal input to the phase detector 16, while input signal 17 is the other input. The phase detector 16 compares the phase of reference signal 15 to the phase of input signal 17 and generates the tuning voltage 58. The magnitude of the tuning voltage 58 update thereby indicates the relative phase between signals 15 and 17. For example, when the phase of the reference signal 15 and the input signal 17 are relatively far apart, the tuning signal 58 update will be a relatively large voltage. However, as the phase of the reference signal 15 and the input signal 17 converge, the tuning voltage 58 update will correspondingly be reduced. In other words, the phase detector 16 adjusts, or updates, the tuning voltage 58 until its input signals 15, 17 have equal frequencies and phase. For example, if the reference signal 15 is lower in frequency than the input signal 17, then the tuning voltage 58 is adjusted until the input signals 15, 17 are matched in frequency and phase.

The tuning voltage 58 is also provided to a feedback circuit 20. The feedback circuit 20 receives the tuning voltage 58 and generates an adjustment signal 53 responsive to the tuning voltage. The adjustment signal 53 is received by the phase detector 16. The phase detector 16 is a variable phase detector with an adjustable gain responsive to adjustment signal 53. For example, when a relatively low tuning voltage 58 is detected by the feedback circuit 20, the feedback circuit generates an adjustment signal 53 that causes the phase detector to have a relatively low current gain. Conversely, when the feedback circuit 20 detects the tuning voltage 58 to be relatively high, the feedback circuit 20 generates an adjustment signal 53 causing the phase detector 16 to have a relatively high current gain. The feedback circuit 20 thereby implements an algorithm that provides that the gain of the phase detector 16 is adjusted responsive to the detected tuning voltage 58.

Figure 2:
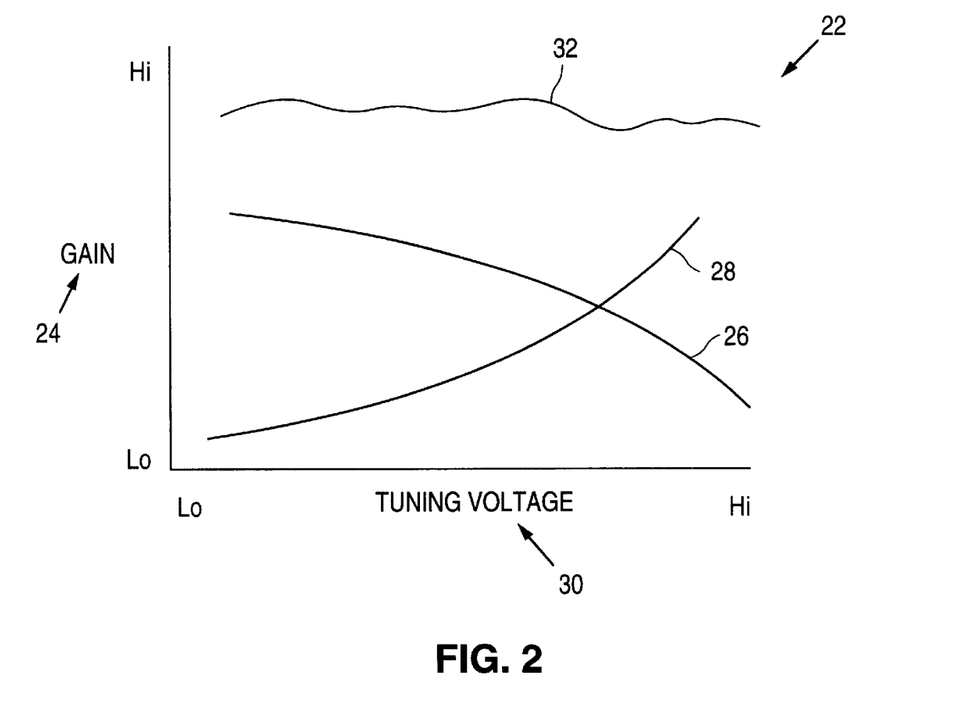
FIG. 2 is a gain chart comparing the current gain of the phase detector to the voltage gain of the VCO.

Referring now to FIG. 2, an exemplary gain graph 22 compares approximate gain curves for the VCO 12 and the phase detector 16. Graph 22 has an x-axis 30 representing tuning voltage 58, with higher tuning voltages represented to the right of the graph. Graph 22 represents gain on the y-axis 24, with relatively higher gains represented towards the top of the graph 22. Graph 22 does not indicate any numerical index of the axis as graph 22 is intended only to convey generalized, or relative, gain information.

As shown in graph 22, as the tuning voltage 58 is adjusted from a relatively low tuning voltage to a relatively high tuning voltage, the VCO voltage gain is reduced in a similarly non-linear fashion, it will be appreciated that although the VCO gain has been represented as VCO gain line 26, the VCO may have other non-linear gain characteristics. To compensate for the non-linear VCO voltage gain, a feedback circuit and adjustment signal are used to adjust the current gain of the phase detector in a manner complementary to the VCO voltage gain. For example, as the tuning voltage 58 moves from a relatively low voltage to a relatively high voltage, the phase detector current gain is increased in a non-linear fashion as represented by phase detector gain line 28. Since the gain characteristic of the phase detector 16 is adjusted to be generally complementary to the VCO gain characteristic, the product of the VCO gain 26 and the phase detector gain 28 is fairly uniform, as represented by product line 32. It will be appreciated however, that in practical implementation, variations due to particular component construction, temperature, power supply voltage, and other variables will affect the linearity in the response of individual components and the circuit. Therefore, even though the product of the VCO gain and the phased detector gain may not be truly linear, the addition of feedback circuit 20 significantly removes response variations due to the non-linearity of the VCO 12. Accordingly time lock becomes less dependent on present conditions and has a more predictable duration. Also, on average, lock time will be reduced as compared to known conventional PLL circuits.

Figure 3:
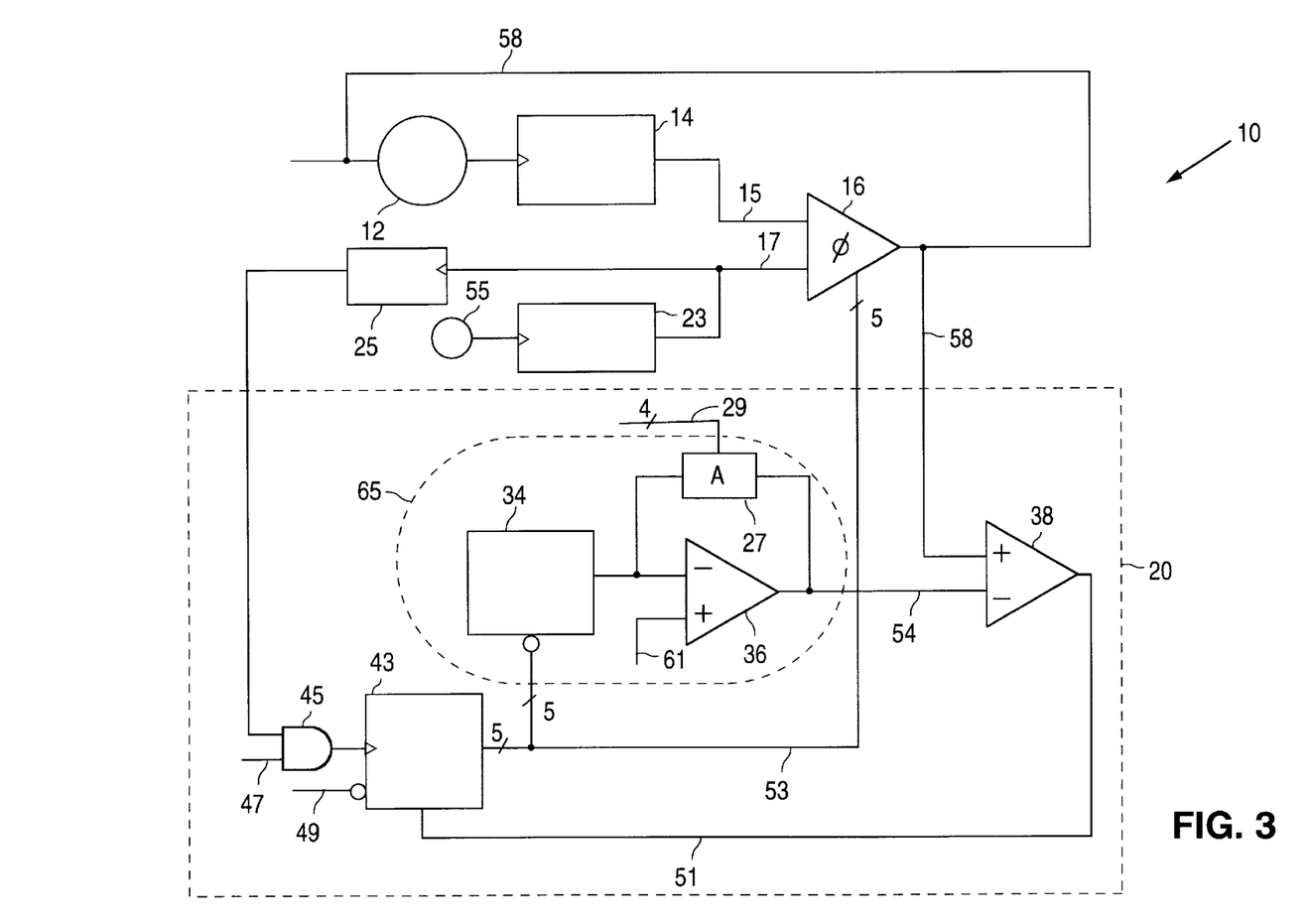
FIG. 3 is a block diagram of a circuit for improving lock-time performance in accordance with the present invention.

Referring now to FIG. 3, the PLL circuit 10 is described in more detail. Since the VCO 12 may be operating at a very high frequency, for example, in the megahertz or even gigahertz ranges, the output of the VCO 12 may be divided by a counter such as counter 14 to generate a reference signal 15 operating at a lower and more easily usable frequency. In a similar manner the input signal, which in FIG. 3 is provided by an oscillator 55, may be divided by counter 23 for providing a input signal 17 at a more usable frequency. Reference signal 15 and input signal 17 are input to the variable phase detector 16, which typically has a charge pump output stage and therefore provides a charge pump output. The charge pump output generates the tuning voltage 58 update, which is used as an adjustment input to the VCO 12. The tuning voltage 58 is also received into the feedback circuit 20. Feedback circuit 20 detects and processes the tuning voltage 58 to generate an adjustment signal 53, which is used to adjust the current gain of the variable phase detector 16.

In the embodiment shown in FIG. 3, the feedback circuit 20 uses an up-down counter 43 to generate a digital value adjustment signal 53. The digital value is then converted into a feedback signal 54 using a digital-to-analog converter (DAC) 65. Since there are only a discrete number of digital states available, there are only a set number of voltage levels available for the feedback signal 54. The digital data generated by the up-down counter 43 is also used as the adjustment signal 53 for adjusting the gain of variable phased detector 16. It will be appreciated, however, that the adjustment signal 53 may take alternative forms. For example, the adjustment signal 53 may be an analog signal.

In the feedback circuit 20, the tuning voltage 58 is received into a voltage comparator 38. The feedback signal 54, which is generated by the digital-to-analog converter 65, is also received by the voltage comparator 38. If the tuning voltage 58 is greater than the feedback voltage 54, then the counter 43 is instructed to increment by one in response to the signal on up-down control line 51. Conversely, if the feedback signal 54 is greater than tuning voltage 58, then counter 43 will decrement by one in response to the signal on up-down control line 51. The incrementing and decrementing of the up-down counter 43 continues until the feedback voltage 54 substantially straddles the tuning voltage 58. More particularly, the tuning voltage 58 is adjusted to be between two available feedback voltage levels. At this time the counter can cease to increment or decrement thereby holding the feedback voltage level constant.

The counter 43 and the up-down control line 51 may be configured, for example, so that the counter 43 increments when the up-down control line transitions to a positive value and decrements when the up-down control line 51 transitions to a negative value. It will be appreciated that other arrangements may be substituted for manipulating an up-down counter. In the preferred embodiment show in FIG. 3, the up-down counter 43 outputs five-bit data. Accordingly, the up-down counter has 32 states with each state representing a number between 0 and 31. It will also be appreciated that other analog or digital techniques may be substituted for comparing the feedback signal to the tuning voltage.

As described above the adjustment signal 53 is received by the variable phase detector 16. The adjustment signal 53 is also an input to the digital-to-analog converter 65. The gain of the digital-to-analog converter 65 is preferably selected so the gain of the variable phase detector is complementary to the voltage gain of the VCO. In the preferred embodiment shown in FIG. 3, a gain select signal 29 is used to select a particular gain for the digital-to-analog converter 65. More particularly, the gain select signal 29 is a four-bit digital input that is received into variable resistor circuit 27. Variable resistor circuit 27 serves as a feedback resistor to operational amplifier 36, therefore selecting the gain for the operational amplifier 36.

The operational amplifier 36 receives and amplifies the output signal from a resistive ladder circuit 34. Resistive ladder circuit 34 is constructed to output a particular voltage responsive to the digital input from adjustment signal 53. More particularly the resistive ladder circuit 34 is constructed as a conventional inverter controlled resistor network. This network will generate up to 32 evenly spaced output voltages depending on what digital number is provided by adjustment signal 53. If the variable resistor circuit 27 is set to provide a gain of unity, then 32 evenly spaced voltages can be generated as feedback signal 54. In a preferred embodiment, the voltages are evenly spaced between 0 and the value VDD of the supply voltage 61. Accordingly, as the value of the adjustment signal 53 is increased from 0 to 31, then the resistive ladder circuit 34 is configured to provide 32 evenly spaced voltage values from 0 volts to VDD. As the variable resistor circuit 27 is adjusted to increase the gain of the operational amplifier 36, however, fewer evenly spaced values may be needed.

In one example, the variable resistor circuit 27 is of conventional design and is composed of five resistors selectively connected in parallel, with four of the resistor connections controlled by transistors used as pass gates. With this configuration 16 resistor values may be generated. Accordingly, gain select signal 29 can be used to select 1 of 16 possible gain settings for the digital-to-analog converter 65.

Figure 4:
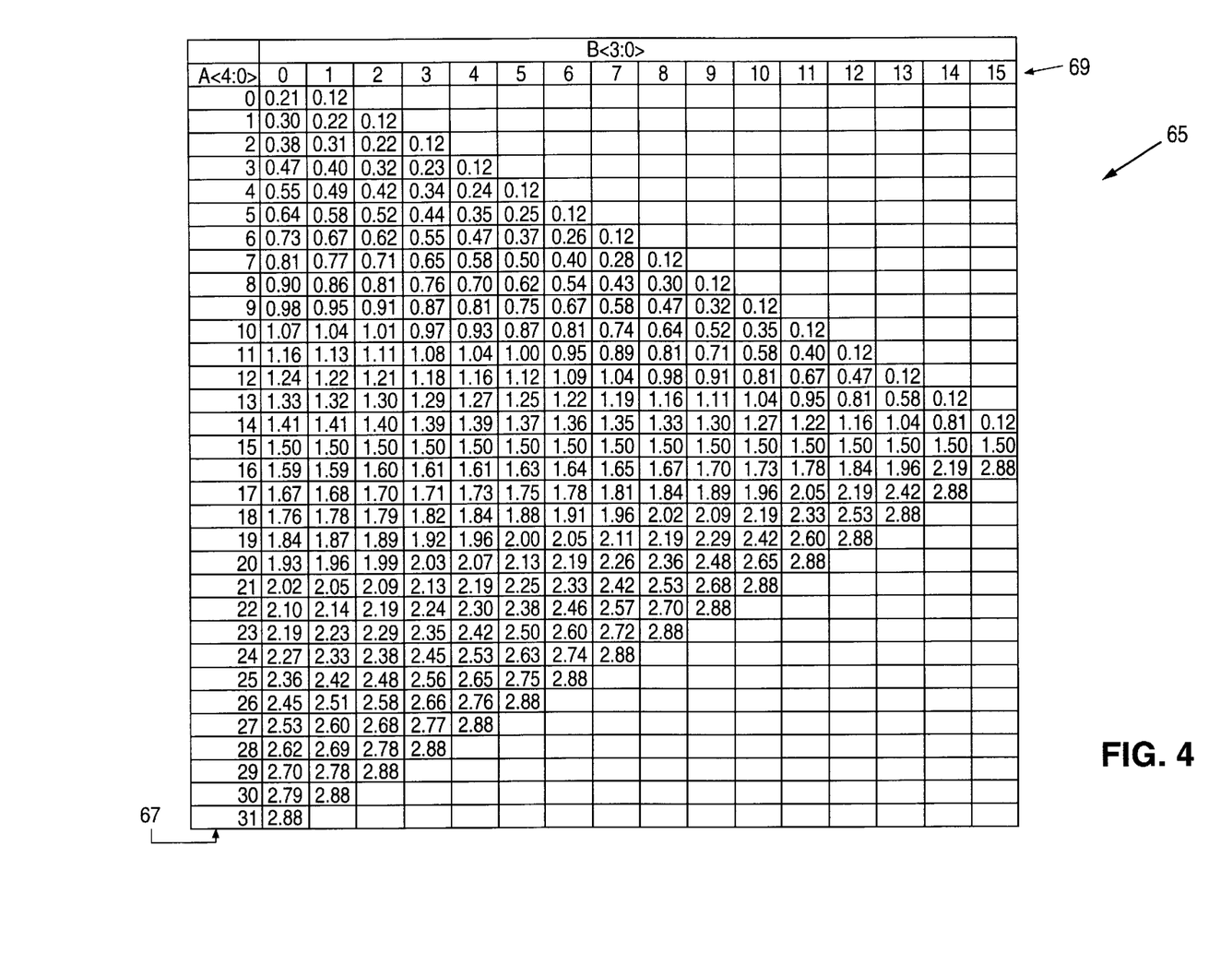
FIG. 4 is a table showing comparator threshold voltages for various VCO (digital-to-analog converter) gain values in accordance with the present invention.

In a preferred embodiment the sixteen resistor values are configured to generate resistor values ranging from between 34 k ohms and 544 k ohms. In such a manner the gain of the digital-to-analog converter 65 may be adjusted from approximately 0.9 when the lowest combination of resistance is selected, to a gain of about 15 when the largest combination of resistance is selected. FIG. 4 illustrates the possible gain permutations when implementing the digital-to-analog converter 65. Table 65 has a column 67 containing the five bits of digital data on the adjustment signal 53 representing the magnitude of the phase detector current. Accordingly, column 67 ranges from 0 to 31. Row 69 represents the possible DAC gain values selected via the four bits of digital data in gain select signal 29. Accordingly, row 69 ranges from 0 to 15. In the example shown in table 65, the voltage supply VDD is set to 3.0 volts. As shown, when the DAC gain select 29 is set to zero, the output voltage 54 from the digital analog converter 65 provides 32 evenly spaced voltages ranging from 0.21 volts to 2.88 volts. For every setting of the DAC gain select signal 29, a different number of comparator threshold voltages are available. For example, if the DAC gain select signal 29 is set to 12, then the digital-to-analog converter 65 will output only nine available comparator thresholds, or "trip" levels. Therefore the digital-to-analog converter 65 will output approximately 0.12 volts when the adjustment signal 53 is set from 0 to 12, indicating charge pump output current gain steps that are too low for the selected VCO gain range. The DAC 65 will output 2.88 volts when the adjustment signal 53 is 19 or higher indicating charge pump output current gain steps that are too high for the selected VCO gain range. The charge pump output current gain magnitude will vary between the 11 and 19 settings as the VCO tuning line voltage 58 varies between about 0.47 volts and about 2.53 volts.

The DAC gain select signal 29 and phase detector current adjustment signal 53 together therefore determine the current magnitude selection range (Kp gain) of the variable phase detector 16. Accordingly, it is desirable to select the appropriate gain characteristic most nearly complementary to the VCO gain characteristic. In such a manner, the VCO gain characteristic is preferably determined. The gain response of the VCO 12 may be determined, for example, by testing or simulation. Further, particular oscillator circuits may be known to have particular gain characteristics. Once the gain characteristic of the VCO 12 is known, then the most appropriate complementary gain curve may be selected by choosing a particular value for gain select signal 29. By properly setting the gain select signal 29, the product of the VCO voltage gain and the phase detector current gain may be made fairly constant. In such a manner variations and disturbances due to non-linear VCO voltage gain may be substantially reduced. More particularly, when the VCO tuning voltage is at a low voltage, the VCO 12 will have a high voltage gain, so the variable phase detector 16 will be set to select a low current gain. In such a manner, the low current gain of the variable phase detector 16 will complement the high voltage gain of the VCO 12. Conversely, when the tuning voltage is relatively high, the voltage gain of the VCO 12 will be lower and the PLL circuit 10 will select a higher current gain for the variable phase detector 16 to keep the product of the VCO gain and the phase detector gain fairly constant. If the VCO gain variation across the tuning voltage range is small, then the number of useful charge pump output current settings would be small.

According to the disclosed circuit, the feedback signal 54 is set to one of a discrete number of available threshold voltage levels, corresponding to the values available from the resistive ladder 34. As described above, the feedback signal 54 is compared to the tuning voltage 58 by comparator 38. In a situation where the tuning voltage 58 is adjusted to a value close to one of the comparator threshold voltages, it is undesirable to cause the variable phase detector or charge pump output to dither or toggle between two adjacent available values (and thereby cause the feedback voltage to dither or toggle between two adjacent available voltages). In a preferred configuration, this dithering effect is minimized or removed by using the least significant bit from the adjustment signal 53 to select when the phase detector 16 charge pump is enabled to change. More particularly, the least significant bit of the signal 53 controls a multiplexer (not shown) within the variable phase detector 16 that can select between providing a new or previously set phase detector 16 charge pump output value. For example, when the least significant bit is low, the multiplexer may cause a new phase detector 16 charge pump output value to be selected. However, when the least significant bit is high, the multiplexer may cause the previously set phase detector 16 charge pump output value to be selected. Accordingly, even when the signal 53 is toggling between two adjacent digital values, the phase detector 16 charge pump output value will be maintained at a constant level. In a particular embodiment, when the least significant bit is high, the multiplexer couples to a Q output of a flip-flop arrangement (not shown, also within the variable phase detector 16) to select the previous voltage output by the resistive ladder 34, and enables a new voltage value to be output from the resistive ladder 34 when the least significant bit is low. It will be appreciated that other circuit configurations may be selected to reduce or remove dithering effects.

In the preferred embodiment, the use of the gain control may be avoided by setting the lock enable 47 to a low state. When the lock enable 47 is set to a low state, the counter 43 is rendered inoperable and the adjustment signal 53 is held constant. In a preferred embodiment the default state for the adjustment signal 53 is 32, which sets the current gain for the variable phase detector 16 to its maximum level. When the gain compensation circuit is employed, the nominal current gain setting is 16. Alternatively, the gain for the variable phase detector 16 may be set using other automated or manual inputs. Also, the feedback circuit 20 may be enabled only during the lock-time period. For example, this time period may be set to a pre-selected number of clock cycles. In a preferred embodiment, a counter, such as counter 25, may be used to enable the up-down counter 43 only during a set number of clock cycles. It will be appreciate that other techniques may be used to enable and disable the feedback circuit 20.

Figure 5:
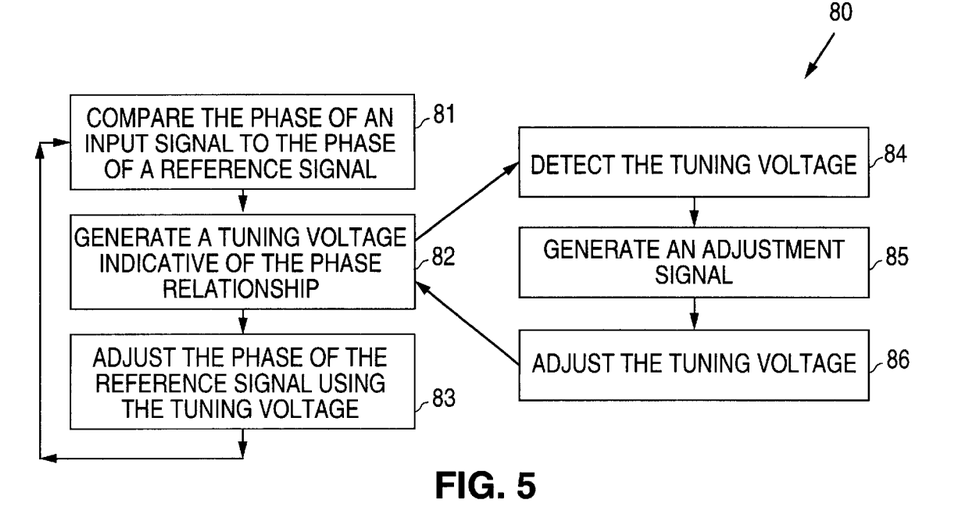
FIG. 5 is a flowchart of a method for improving lock-time in accordance with the present invention.

Referring now to FIG. 5, a method of providing gain control 80 for a phase-locked loop circuit is shown. In the method of gain control 80, the phase of an input signal is compared to the phase of a reference signal in block 81. A tuning voltage update is generated that is indicative of the phase relationship in block 82. The phase of the reference signal is then adjusted using the tuning voltage as shown in block 83. The process of comparing, generating and adjusting continues until the input and reference signals are synchronized. When the tuning voltage is generated in block 82, the tuning voltage is also detected in a feedback circuit as indicated in block 84. Responsive to the tuning voltage, an adjustment signal is generated in block 85. The modified adjustment signal is used to adjust the tuning voltage (e.g., by adjusting the charge pump output current) in block 86 (thereby adjusting the phase detector gain). In a preferred embodiment discussed earlier, the tuning voltage update is adjusted by changing the gain of a variable phase detector. However, it will be appreciated that the tuning voltage update could be adjusted using other methods such as providing variable amplification or attenuation of some form of fixed reference voltage.

Figure 6:
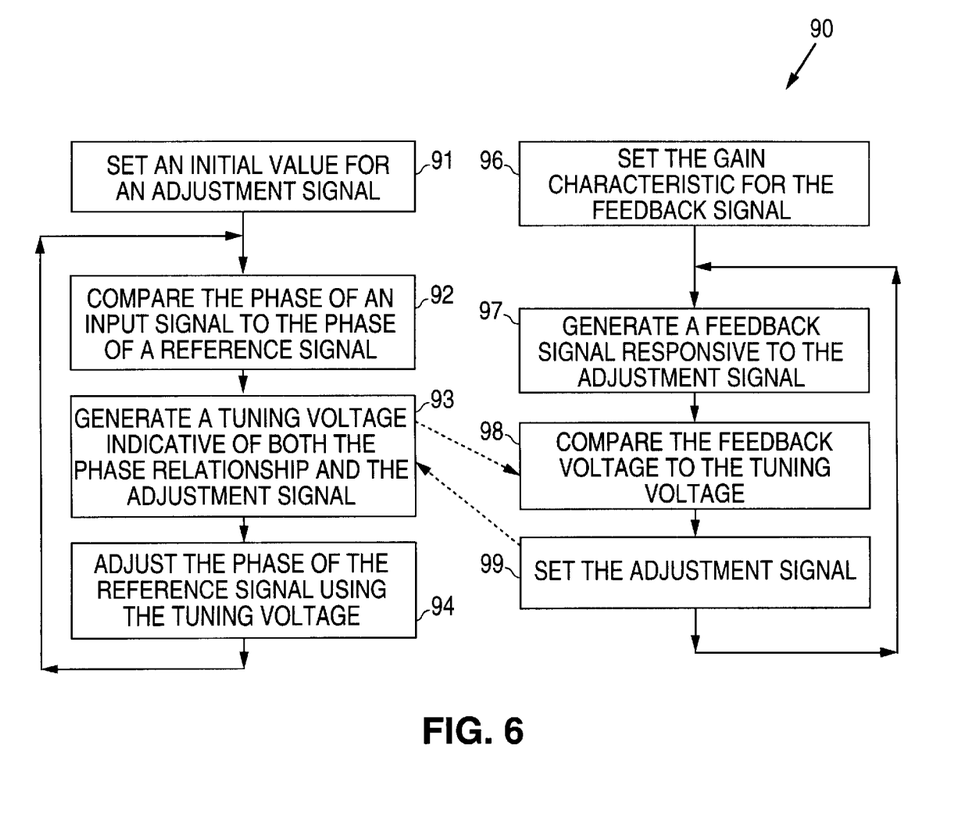
FIG. 6 is a flowchart of another method for improving lock-time in accordance with the present invention.

Referring now to FIG. 6, a more detailed method 90 of adjusting the gain of a phase-locked loop is shown. In block 91, an initial value is set for an adjustment signal and in block 96 the gain characteristics are set for the feedback signal. Accordingly, the method 90 is initialized. In block 92, the phase of an input signal is compared to the phase of a reference signal. A tuning voltage update indicative of the phase relationship is generated in block 93. The tuning voltage update generated in block 93 is also adjusted by the adjustment signal. In block 94, the phase of the reference signal is adjusted using the tuning voltage. With the phase of the reference signal adjusted, the method 90 loops back to compare the phase of the input signal to the phase of the reference signal in block 92. In such a manner, the reference signal is synchronized with the input signal during the lock-time period.

In block 97, a feedback signal is generated responsive to the present setting of the adjustment signal. The tuning voltage, which has been generated in block 93, is compared to the feedback voltage in block 98. The adjustment signal is adjusted to reflect the relationship between the feedback voltage and the tuning voltage. The adjustment signal, which is set in block 99, is used in block 93 as a factor in generating the tuning voltage. Thereby, blocks 96, 97, 98, and 99 provide a feedback process compensating for the non-linear gain of the voltage control oscillator.

Figure 7:
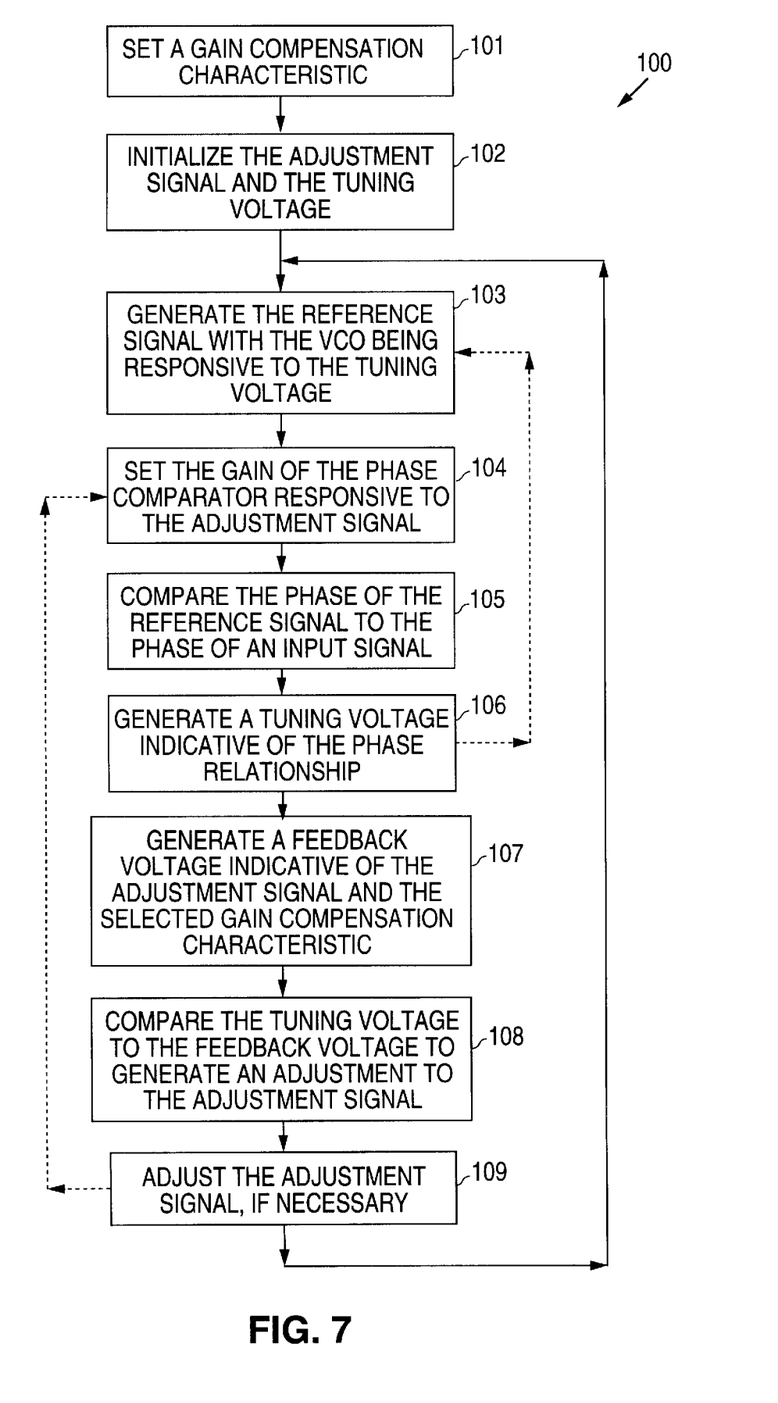
FIG. 7 is a flowchart of still another method for improving lock-time in accordance with the present invention.

Referring now to FIG. 7, another method 100 of adjusting the gain of a PLL circuit is shown. In method 100, a gain compensation characteristic is set in block 101. For example, the gain compensation characteristic can be indicative of the non-linear characteristics of the VCO. In a preferred embodiment, the gain compensation characteristic is selected by choosing one of sixteen resistor values in a digital-to-analog converter. In such a manner, the gain characteristics of the digital-to-analog converter can be adjusted to more accurately complement the gain characteristics of a VCO. In block 102, the adjustment signal and the tuning voltage are initialized. For example, the adjustment signal can be set to its maximum value thereby setting the current gain of the variable phase detector to its maximum setting. It will be appreciated that other initialization values could be selected. In a similar manner, the tuning voltage can be initialized to a value near the expected final tuning voltage value. With the system initialized, the VCO generates a reference signal in response to the tuning voltage in block 103. In block 104, the gain of the phase comparator is set responsive to the value of the adjustment signal. Although the adjustment signal is initially set in block 102, as the circuit advances the adjustment signal may be additionally adjusted in block 109, which will be described below.

In block 105, the phase of the reference signal is compared to the phase of an input signal. A tuning voltage update indicative of the phase relationship is generated in block 106. As indicated in FIG. 7, the tuning voltage update generated in block 106 is used to adjust the frequency of the reference signal being generated in block 103. In block 107, a feedback voltage is generated that is based both on the value of the adjustment signal and the selected gain compensation characteristic. This feedback voltage is then compared to the tuning voltage and an adjustment to the adjustment signal may be indicated as shown in block 108.

In a preferred embodiment, when the tuning voltage and the feedback voltage are compared, a signal may be generated that causes a counter to increment or decrement depending upon the relationship of the voltages. If the voltages are acceptably close, then no adjustment would be necessary. If an adjustment to the adjustment signal is necessary, that adjustment is made in block 109. The system then continues adjusting the reference signal until the reference signal is synchronized with the input signal. At the end of the lock-time, which may be a predetermined number of clock cycles, the feedback circuit may also be disabled.

One skilled in the art will appreciate that the present invention can be practiced by other than the preferred embodiments which are presented in this description for purposes of illustration and not of limitation, and the present invention is limited only by the claims which follow. It is noted that equivalents for the particular embodiments discussed in this description may practice the invention as well.

What is claimed is:

1. A method of gain control for a phase-locked circuit, comprising:

detecting a tuning voltage;

generating an adjustment signal responsive to the tuning voltage by comparing the tuning voltage to a feedback voltage;

adjusting the tuning voltage using the adjustment signal;

generating the feedback voltage using a digital-to-analog converter; and adjusting the tuning voltage to be between two adjacent available feedback voltages, the available feedback voltages being generated responsive to a digital input to the digital to analog converter.

2. The method according to claim 1, further including holding the feedback voltage constant when the tuning voltage is between two adjacent available feedback voltages.

3. A method of gain control for a phase-locked circuit, comprising:

detecting a tuning voltage;

generating an adjustment signal responsive to the tuning voltage and including at least three values; and adjusting the tuning voltage using the adjustment signal, including adjusting the gain of a phase detector, wherein said tuning voltage comprises an analog signal including a plurality of values that vary in relation to said at least three adjustment signal values.

4. The method according to claim 3, wherein adjusting the gain of phase detector includes adjusting the current gain of the phase detector.

5. A method of gain control for a phase-locked circuit, comprising:

detecting a tuning voltage;

generating an adjustment signal responsive to the tuning voltage and including at least three values; and adjusting the tuning voltage, including adjusting the gain of a phase detector, using the adjustment signal, wherein the gain of the phase detector is inversely adjusted relative to the detected tuning voltage, and said tuning voltage comprises an analog signal including a plurality of values that vary in relation to said at least three adjustment signal values.

6. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal; and a feedback circuit operably connected to the variable gain phase detector to receive the tuning voltage and generate the adjustment signal;

wherein said adjustment signal includes at least three values and said tuning voltage comprises an analog signal including a plurality of values that vary in relation to said at least three adjustment signal values.

7. The phase-locked loop circuit according to claim 6, wherein the feedback circuit is configured to generate the adjustment signal as a digital value.

8. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal, wherein said adjustment signal includes at least three values and said tuning voltage comprises an analog signal including a plurality of values that vary in relation to said at least three adjustment signal values; and a feedback circuit operably connected to the variable gain phase detector to receive the tuning voltage and generate the adjustment signal, wherein the feedback circuit includes a comparator that compares a feedback voltage to the tuning voltage.

9. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal;

a feedback circuit operably connected to the variable gain phase detector to receive the tuning voltage and generate the adjustment signal, wherein the feedback circuit includes a comparator that compares a feedback voltage to the tuning voltage; and a converter circuit for converting the adjustment signal into the feedback voltage.

10. The phase-locked loop circuit according to claim 9, wherein the converter circuit comprises a digital-to-analog converter.

11. The phase-locked loop circuit according to claim 10, where the converter circuitry further includes holding circuitry that holds the feedback voltage and phase detector gain constant when the tuning voltage is between two adjacent available voltage values.

12. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal; and a feedback circuit operably connected to the variable gain phase detector to receive the tuning voltage and generate the adjustment signal, wherein the feedback circuit includes a counter for generating the adjustment signal.

13. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal, wherein said adjustment signal includes at least three values and said tuning voltage comprises an analog signal including a plurality of values that vary in relation to said at least three adjustment signal values; and a feedback circuit operably connected to the variable gain phase detector to receive the tuning voltage and generate the adjustment signal, wherein the feedback circuit has an input for selecting a gain characteristic.

14. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal; and a feedback circuit operably connected to the variable gain phase detector to receive the tuning voltage and generate the adjustment signal, wherein the feedback circuit has an enable input for conditionally enabling the feedback circuit.

15. A phase-locked loop circuit, comprising:

a voltage controlled oscillator that outputs a reference signal in response to a tuning voltage;

a variable gain phase detector circuit coupled to the voltage controlled oscillator and to receive an adjustment signal and output a tuning voltage update, the tuning voltage update being indicative of a phase difference between an input signal and the reference signal;

a feedback circuit operably connected to the variable gain phase detector to receive the tuning voltage and generate the adjustment signal; and a clock cycle counter that enables the feedback circuit for a pre-selected number of clock cycles.

* * * * *

UNITED STATES PATENT AND TRADEMARK OFFICE
CERTIFICATE OF CORRECTION

PATENT NO.    : 6,624,707 B1  
DATED         : September 23, 2003  
INVENTOR(S)   : Davis et al.

It is certified that error appears in the above-identified patent and that said Letters Patent is hereby corrected as shown below:

<u>Column 4,</u>  
Line 15, after "counter 23 for providing" please delete "a" and replace with -- an --  
Line 60, please delete "show" and replace with -- shown --

<u>Column 5,</u>  
Line 55, please delete "digital analog" and replace with -- digital-to-analog --

<u>Column 7,</u>  
Line 20, please delete "appreciate" and replace with -- appreciated --

<u>Column 9,</u>  
Line 4, please delete "digital to analog" and replace with -- digital-to-analog --

Signed and Sealed this

Ninth Day of March, 2004

JON W. DUDAS  
*Acting Director of the United States Patent and Trademark Office*